(12) United States Patent
Thompson et al.

(10) Patent No.: US 7,091,771 B2
(45) Date of Patent: Aug. 15, 2006

(54) SEGMENTED CHOPPING AMPLIFIER

(75) Inventors: Karl Thompson, Converse, TX (US); John L. Melanson, Austin, TX (US); Chung-Kai Chow, Austin, TX (US); Ammisetti V. Prasad, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/687,416

(22) Filed: Oct. 16, 2003

(65) Prior Publication Data

US 2004/0140847 A1 Jul. 22, 2004

Related U.S. Application Data

(60) Provisional application No. 60/441,296, filed on Jan. 21, 2003.

(51) Int. Cl.
*H03F 1/02* (2006.01)

(52) U.S. Cl. .......................................... 330/9
(58) Field of Classification Search ................ 330/9, 330/51; 327/124, 307
See application file for complete search history.

(56) References Cited

U.S. PATENT DOCUMENTS

| | | | |
|---|---|---|---|
| 5,039,989 A | 8/1991 | Welland et al. | |
| 6,262,626 B1 * | 7/2001 | Bakker et al. | 330/9 |
| 6,307,430 B1 * | 10/2001 | Thomsen et al. | 330/9 |
| 6,380,801 B1 * | 4/2002 | McCartney | 330/9 |
| 6,476,671 B1 * | 11/2002 | Tang | 330/9 |

OTHER PUBLICATIONS

Enz and Temes, "Circuit Techniques for Reducing the Effects of Op-Amp Imperfections: Autozeroing, Correlated Double Sampling and Chopper Stabilization," Proc. of the IEEE, 84(11):1584-1614, Nov. 1996.

* cited by examiner

*Primary Examiner*—Khanh Van Nguyen
(74) *Attorney, Agent, or Firm*—Steven Lin

(57) ABSTRACT

A chopping amplifier and method for chopping an input signal are disclosed. The chopping amplifier and method utilize at least two chopping amplifier stages. A chopping operation of an input signal is segmented across two or more chopping amplifier stages, and the two or more chopping amplifier stages are responsive to a master controller. Chop clock signals of the chopping amplifier stages are staggered so that they have non-overlapping periods and at least one of the chopping amplifier stages is not operating in an open loop at any given time. The non-overlapping periods are periodic so that a master chop clock of the master controller can be operated at a lower chop clock frequency. For every doubling of N number of chopping amplifier stages, magnitudes of chopping artifacts and aliased components are each respectively reduced by 3 dB.

22 Claims, 6 Drawing Sheets

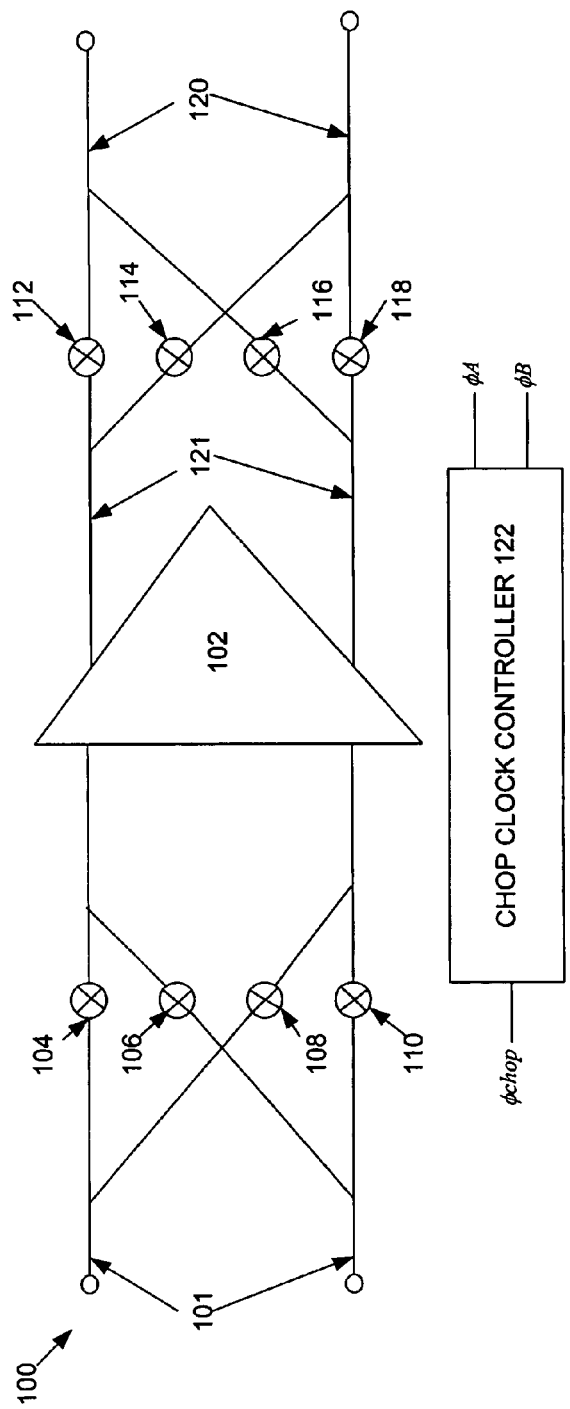
FIGURE 1 - PRIOR ART
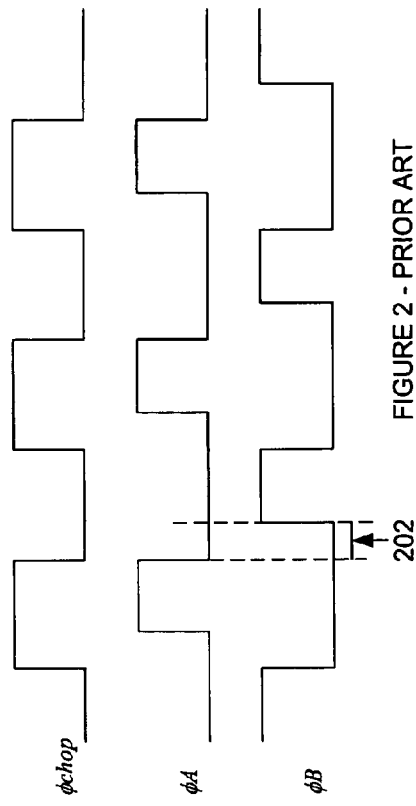
FIGURE 2 - PRIOR ART

SEGMENTED CHOPPING AMPLIFIER

BACKGROUND OF THE INVENTION

This application claims priority to U.S. Provisional Patent Application No. 60/441,296, filed on Jan. 21, 2003, and is incorporated herein in its entirety.

1. Field of the Invention

The present invention relates to an amplifier, and, more particularly, to a chopping amplifier. More specifically, the present invention relates to a segmented chopping amplifier.

2. Description of Related Art

An amplifier may have several non-idealities, which affect the overall quality of signals that the amplifier processes. Some of these non-idealities are offset, 1/f noise, and thermal noise. Offset is spectrally represented as a signal with a zero frequency and an amplitude equivalent to the magnitude of the offset. The 1/f noise, as its name implies, is inversely proportional to frequency, and thermal noise is constant across all frequencies. The key feature is the frequency at which the magnitude of the 1/f noise is equal to the thermal noise. This frequency is known as the 1/f corner frequency and is typically located in the frequency domain between 1 kHz to 1 MHz for most amplifiers.

For most applications, the input signals that are applied to an amplifier are limited in frequency. For the input signals that fall below the 1/f corner frequency and have amplitudes less than the 1/f noise at the same frequency, the signal then becomes lost. Chopping techniques for amplifiers have been utilized to modulate the offset and the 1/f noise to a higher frequency (e.g., a portion of the spectrum about a chop clock frequency $f_{chop}$ at which no 1/f noise exist). Low pass filtering of the signal then removes the offset and the 1/f noise and ideally leaves the signal only with thermal noise. Exemplary chopping techniques have been described in "Circuit Techniques for Reducing the Effects of Op-Amp Imperfections: Autozeroing, Correlated Double Sampling, and Chopper Stabilization" by Christian C. Enz and Gabor C. Temes, IEEE Proceedings, November 1996 and U.S. Pat. No. 5,039,989 entitled "Delta-Sigma Analog-to-Digital Converter with Chopper Stabilization at the Sampling Frequency" to Welland et al.

With reference now to FIG. 1, a chopping amplifier 100 according to the prior art is shown. Chopping amplifier 100 receives a differential input signal 101 and provides a differential output signal 120. Chopping amplifier 100 has a chop clock controller 122. Chop clock controller 122 is coupled to input chopping switches 104, 106, 108, and 110 and output chopping switches 112, 114, 116, and 118 and controls these switches.

Input and output chopping switches 104, 106, 108, 110, 112, 114, 116, and 118 are divided into two groups. The first group includes input chopping switches 104, 110 and output chopping switches 112, 118, which are controlled by clock signal $\phi_A$ of chop clock controller 122. The second group includes input chopping switches 106, 108 and output chopping switches 114, 116, which are controlled by clock signal $\phi_B$ of chop clock controller 122. Referring now to FIG. 2, a timing diagram for the clock signals of chop clock controller 122 according to the prior art is shown. Chop clock controller 122 generates the clock signals $\phi_A$ and $\phi_B$ according to a master chop clock signal $\phi$chop. Clock signals $\phi_A$ and $\phi_B$ are non-overlapping clock signals as shown in the timing diagram of FIG. 2. Non-overlapping clock signals $\phi_A$ and $\phi_B$ are needed to drive input and output chopping switches 104, 106, 108, 110, 112, 114, 116, and 118 and to avoid shorting of inputs and outputs due to delays. A non-overlap period 202 illustrates the nature of non-overlapping clock signals $\phi_A$ and $\phi_B$.

Chopping amplifier 100 modulates input signal 101 to a higher portion of the frequency spectrum, such as a chop clock frequency $f_{chop}$ of chop clock signal $\phi$chop. Generally, no 1/f noise exists at the chop clock frequency $f_{chop}$. Chopping amplifier 100 amplifies input signal 101 and adds the 1/f noise and the thermal noise to produce an output signal 121 (before output switches 112, 114, 116, and 118). Output signal 121 of chopping amplifier 100 is modulated by the output chopping switches 112, 114, 116, and 118. The net effect of the switching by output chopping switches 112, 114, 116, and 118 is the demodulation of the input signal back to the baseband (e.g., f=0) and the modulation of the 1/f noise and the offset to the higher frequency $f_{chop}$ where they are removed by low pass filtering. Thus, chopping amplifier 100 ideally eliminates errors due to the 1/f noise and offset during the amplification process.

However, chopping amplifier 100 has some non-idealities that could lead to distortion, excess noise above and beyond the thermal noise, and/or residual offset. For example, non-idealities exist in the asymmetries between clock signals $\phi_A$ and $\phi_B$ and when chopping amplifier 100 is operating in the open loop during the non-overlap periods (e.g., non-overlap period 202).

In a traditional chopping scheme, operational amplifier 102 is operating in an open loop (e.g., all input and output chopping switches 104, 106, 108, 110, 112, 114, 116, and 118 are open) during the non-overlap periods. This open loop situation can cause the output of operational amplifier 102 to runaway. Depending upon the nature of the runaway, distortion, noise, and/or residual offset may result. Furthermore, during the non-overlap period, input signal 101 is sampled and held at the input of operational amplifier 102. Any broadband noise near the edge rate (e.g., twice the chopping frequency $2*f_{chop}$ of chopping clock signal $\phi$chop) gets aliased down to the frequency baseband, which causes severe degradation of dynamic range and linearity. This aliasing of the noise is especially problematic in over-sampled data converters which have a large amount of shaped quantization noise at or near twice the chopping frequency $2*f_{chop}$.

The present invention recognizes the desire and need for providing an improved chopping amplifier. The present invention further recognizes the desire and need to provide a chopping amplifier that resolves the open loop problem and avoids the runaway situation. The present invention also recognizes the need and desire for a chopping amplifier that reduces aliasing of noise to the frequency baseband and the magnitude of chopping artifacts. The present invention overcomes the problems and disadvantages in accordance with the prior art.

SUMMARY OF THE INVENTION

A chopping amplifier and method for chopping an input signal are disclosed. The chopping amplifier and method utilize at least two chopping amplifier stages. A chopping operation of an input signal is segmented across two or more chopping amplifier stages, and the two or more chopping amplifier stages are responsive to a master controller. Chop clock signals of the chopping amplifier stages are staggered so that they have non-overlapping periods and at least one of the chopping amplifier stages is not operating in an open loop at any given time. The non-overlapping periods are periodic so that a master chop clock of the master controller can be operated at a lower chop clock frequency. For every doubling of N number of chopping amplifier stages, magnitudes of chopping artifacts and the aliased components are each respectively reduced by 3 dB.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 1 is a detailed block diagram of an exemplary chopping amplifier according to the prior art;

FIG. 2 are exemplary timing diagrams of a master clock signal and non-overlapping clock signals for the chopping amplifier of FIG. 1 according to the prior art;

DETAILED DESCRIPTION OF THE INVENTION

A segmented chopping amplifier and method for chopping an input signal across a number of segmented chopping amplifier stages are disclosed.

Figure 3A:
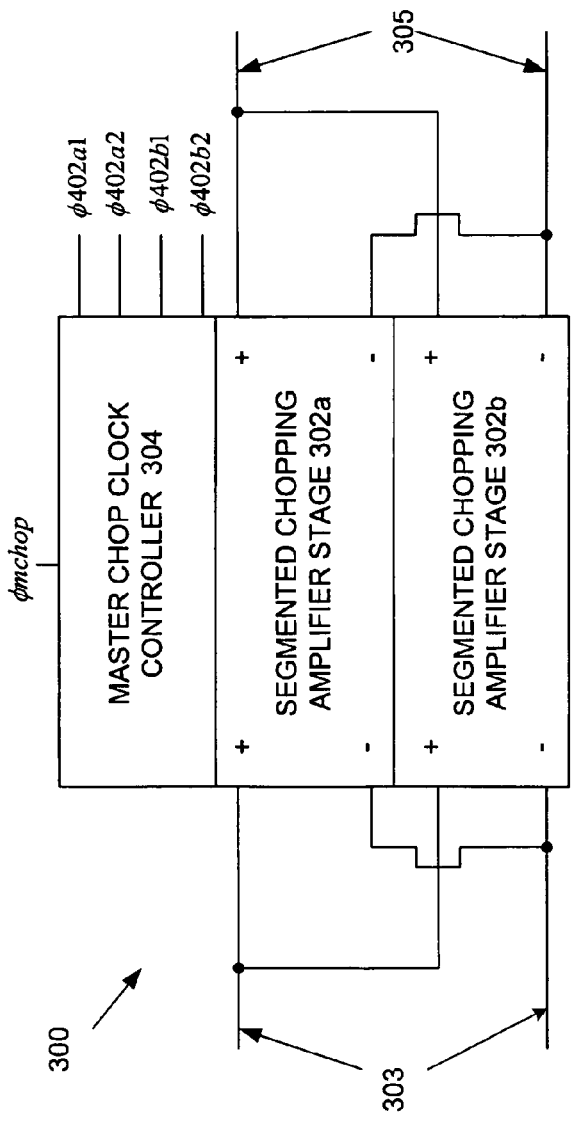
FIG. 3A is a block diagram of an exemplary segmented chopping amplifier with two segmented chopping amplifier stages according to the present invention.

With reference now to FIG. 3A, a block diagram of an exemplary segmented chopping amplifier 300 having two segmented chopping amplifier stages 302a and 302b and a master chop clock controller 304 according to the present invention is shown. The present invention can be a segmented chopping amplifier having N number of segmented chopping amplifier stages, in which N is an integer value greater than one. Each segmented chopping amplifier stage contributes 1/N amount of the overall gain of the segmented chopping amplifier. The N number of segmented chopping amplifier stages are coupled in parallel to each other. Segmented chopping amplifier 300 is an exemplary segmented chopping amplifier 300 in which N equals two since it has two segmented chopping amplifier stages 302a and 302b.

Segmented chopping amplifier 300 segments the chopping operation of differential input signal 303 across the two segmented chopping amplifier stages 302a and 302b. Segmented chopping amplifier 300 generates differential output signal 305 from the two segmented chopping amplifier stages 302a and 302b. The two segmented chopping amplifier stages 302a and 302b are coupled in parallel to each other and are responsive to master chop clock controller 304. Master chop clock controller 304 has a master chop clock signal $\phi$mchop with a chopping frequency fmchop.

Figure 3B:
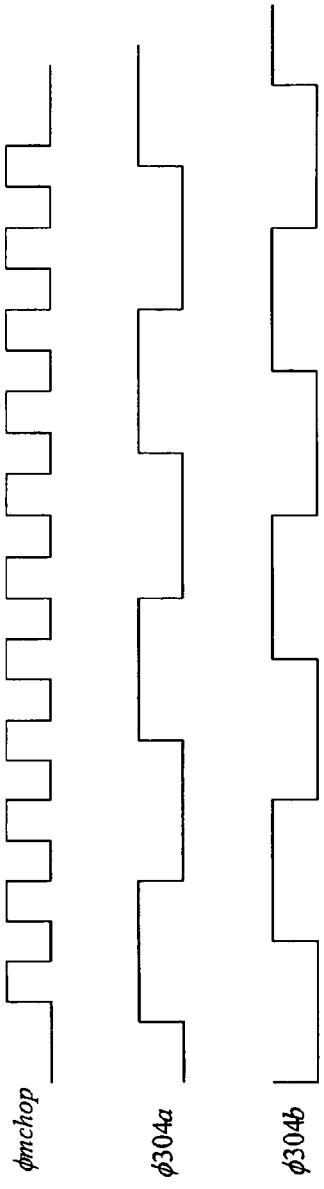
FIG. 3B are exemplary timing diagrams of a master clock signal and main chop clock signals for generating non-overlapping chop clock signals for the segmented chopping amplifier of FIG. 3A.

Referring now to FIG. 3B, exemplary timing diagrams of master clock signal $\phi$mchop of master chop clock controller 304 and main chop clock signals $\phi$304a and $\phi$304b for corresponding clock amplifier stages 302a and 302b are shown. Main chop clock signals $\phi$304a and $\phi$304b are derived and based on master chop clock signal $\phi$mchop. Main chop clock signals $\phi$304a and $\phi$304b are used by a non-overlapping clock generator (not shown) to generate non-overlapping clock signals for clock amplifier stages 302a and 302b. The non-overlapping clock signals will be discussed later in more detail. Master chop clock controller 304 controls operations of segmented chopping amplifier stages 302a and 302b. Master chop clock controller 304 can independently control the two segmented chopping amplifier stages 302a and 302b. Also, each segmented chopping amplifier stage 302a and 302b can perform its own independent chopping operation.

Figure 4:
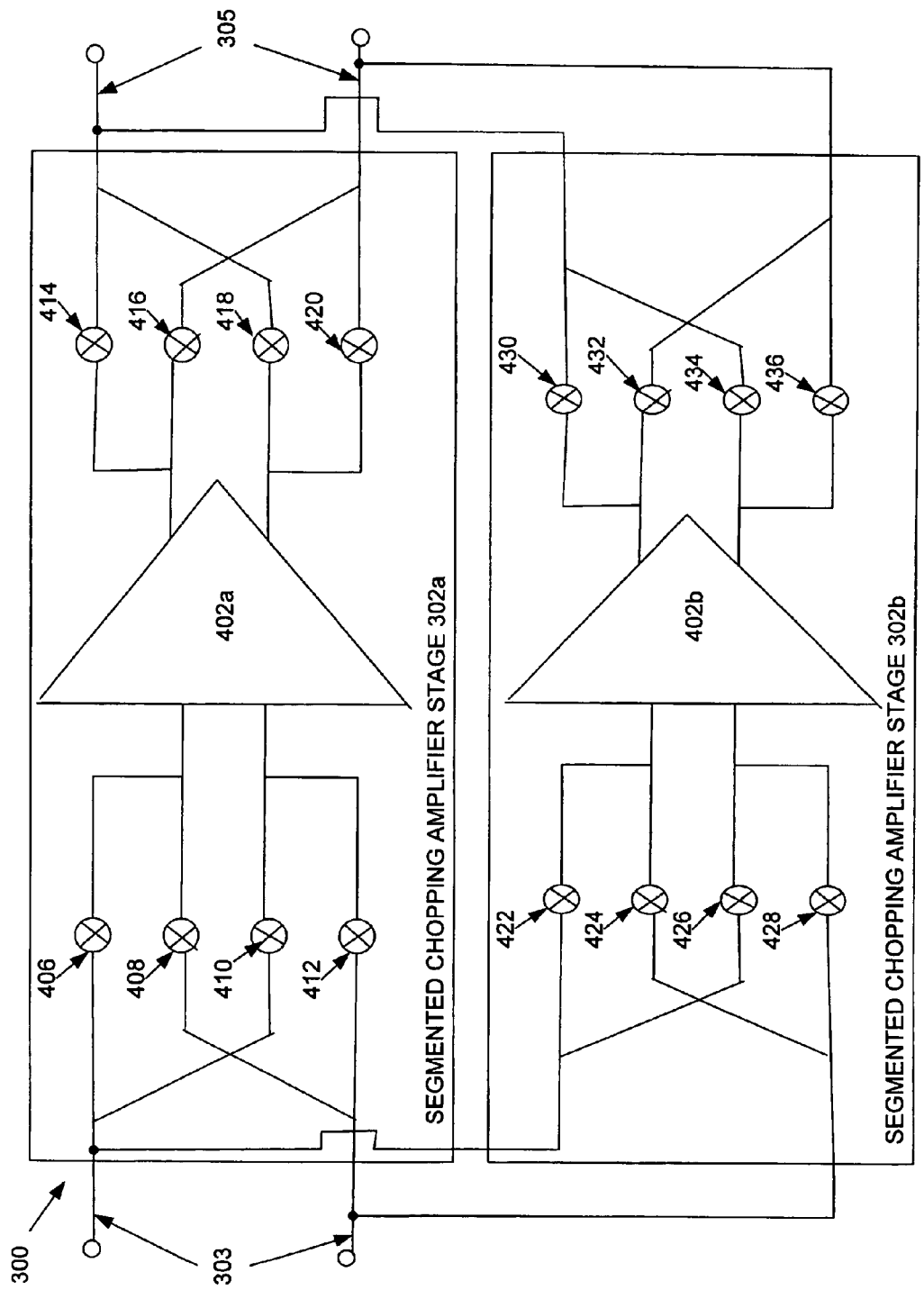
FIG. 4 is a detailed block diagram of the exemplary segmented chopping amplifier of FIG. 3A.

With reference now to FIG. 4, segmented chopping amplifier 300 of FIG. 3A is shown in more detail. Segmented chopping amplifier stage 302a has a differential operational amplifier 402a, input chopping switches 406, 408, 410, and 412, and output chopping switches 414, 416, 418, and 420. Segmented chopping amplifier stage 402b has a differential operational amplifier 402b, input chopping switches 422, 424, 426, and 428, and output chopping switches 430, 432, 434, and 436. Input chopping switches 406, 408, 410, 412, 422, 424, 426, and 428 are coupled to input signal 303 as shown in FIG. 4. Output chopping switches 414, 416, 418, 420, 430, 432, 434, and 436 are coupled to output signal 305 as shown in FIG. 4.

As shown in FIG. 3A, segmented chopping amplifier 300 has a master chop clock controller 304. Master chop clock controller 304 is coupled to input chopping switches 406, 408, 410, 412, 422, 424, 426, and 428 and output chopping switches 414, 416, 418, 420, 430, 432, 434, and 436 and controls these switches.

Figure 5:
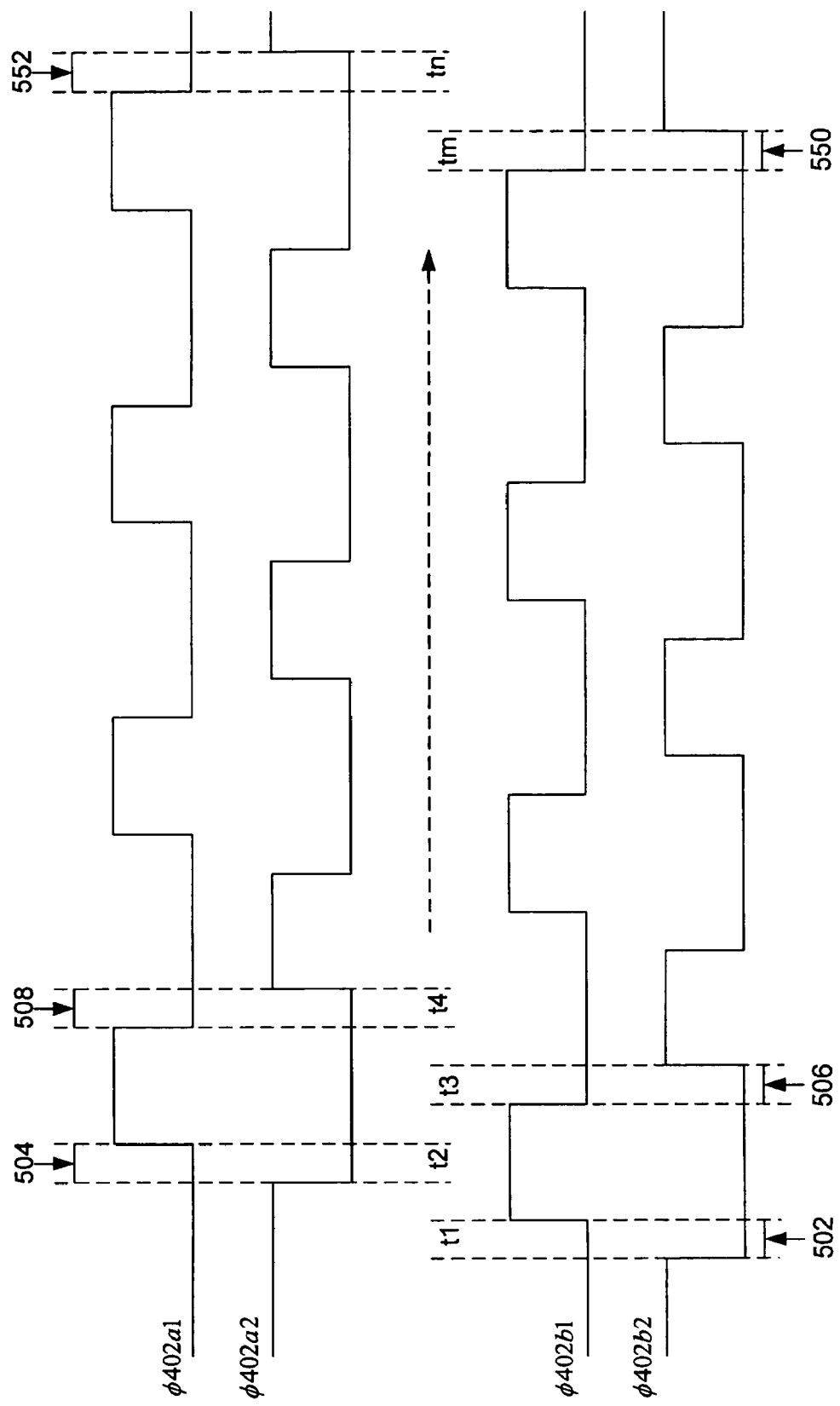
FIG. 5 are exemplary timing diagrams of non-overlapping chop clock signals for the segmented chopping amplifier having two segmented chopping amplifier stages as shown in FIGS. 3A and 4.

Referring now to FIG. 5, exemplary timing diagrams of non-overlapping chop clock signals $\phi$402a1, $\phi$402a2, $\phi$402b1, and $\phi$402b2 for segmented chopping amplifier 300 having two segmented chopping amplifier stages 302a and 302b of FIGS. 3A and 4 are shown. Input chopping switches 406, 408, 410, and 412 and output chopping switches 414, 416, 418, and 420 of segmented chopping amplifier stage 302a are divided into two groups. The first group includes input chopping switches 406, 412 and output chopping switches 414, 420, which are controlled by clock signal $\phi$402a1 from master chop clock controller 304. The second group includes input chopping switches 408, 410 and output chopping switches 416, 418, which are controlled by clock signal $\phi$402a2 from master chop clock controller 304. Furthermore, input chopping switches 422, 424, 426, and 428 and output chopping switches 430, 432, 434, and 436 of segmented chopping amplifier stage 302b are divided into two further groups. The third group includes input chopping switches 422, 428 and output chopping switches 430, 436, which are controlled by clock signal $\phi$402b1 from master chop clock controller 304. The fourth group includes input chopping switches 424, 426 and output chopping switches 432, 434, which are controlled by clock signal $\phi$402b2 from master chop clock controller 304.

Non-overlapping clock signals $\phi$402a1, $\phi$402a2, $\phi$402b1, and $\phi$402b2 are needed to drive input chopping switches 406, 408, 410, 412, 422, 424, 426, and 428 and output chopping switches 414, 416, 418, 420, 430, 432, 434, and 436 and to avoid shorting of inputs and outputs due to delays. In FIG. 5, non-overlap periods 502, 504, 506, 508, . . . , 550, 552 illustrate the nature of non-overlapping clock signals φ402a1, φ402a2, φ402b1, and φ402b2.

Chopping amplifier 300 modulates input signal 303 to a higher portion of the frequency spectrum, such as chop clock frequency fmchop of chop clock signal φmchop. Generally, no 1/f noise exists via the input chopping switches 406, 408, 410, 412, 422, 424, 426, and 428 at the chop clock frequency fmchop. Chopping amplifier 300 amplifies input signal 303 and adds the 1/f noise and the thermal noise to produce an output signal 305. Output signal 305 of chopping amplifier 300 is modulated by the output chopping switches 414, 416, 418, 420, 430, 432, 434, and 436. The net effect of the switching by output chopping switches 414, 416, 418, 420, 430, 432, 434, and 436 is the demodulation of the input signal back to the baseband (e.g., f=0) and the modulation of the 1/f noise and the offset to the higher frequency fmchop, where they are removed by low pass filtering. Thus, chopping amplifier 300 eliminates errors due to the 1/f noise and offset during the amplification process.

With reference to FIG. 5, non-overlap periods 502, 504, 506, 508, . . . , 550, 552 are out of synchronization (e.g., not aligned) and do not occur at the same time with respect to each other. For example, non-overlap period 502 occurs at time t1, non-overlap period 504 occurs at time t2, non-overlap period 506 occurs at time t3, non-overlap period 508 occurs at time t4, . . . , non-overlap period 550 occurs at time tm, non-overlap period 552 occurs at time tn. In other words, non-overlapping clock signals φ402a1, φ402a2, φ402b1, and φ402b2 are staggered so that at least one of the two segmented chopping amplifier stages 302a and 302b is not operating in an open loop at any given time.

For example, in FIG. 5, at each respective times t1, t3, . . . tm, chopping amplifier stage 302b is operating in an open loop (e.g., all input chopping switches 422, 424, 426, and 428 and output chopping switches 430, 432, 434, and 436 are open) while chopping amplifier stage 302a is not operating in an open loop. At these times while chopping amplifier stage 302b is in the open loop, chopping amplifier stage 302a defines output signal 305. Additionally, at each respective times t2, t4, . . . , tn, chopping amplifier stage 302a is operating an open loop (e.g., input chopping switches 406, 408, 410, and 412 and output chopping switches 414, 416, 418, and 420 are open) while chopping amplifier stage 302b is not operating in the open loop. At these times while chopping amplifier stage 302a is in the open loop, chopping amplifier stage 302b defines output signal 305. By driving the output in this manner, the open loop problem is averted and the runaway situation is avoided since the chopping amplifier stage not operating in open loop drives output signal 305.

With further reference to FIG. 5, the occurrences of non-overlapping periods 502, 504, 506, 508, . . . , 550, 552 happen at regular times and are periodic (e.g., times t1, t2, t3, t4, . . . , tm, tn are each equally spaced apart in time). More specifically, the non-overlapping periods occur at regular times or periods since non-overlapping clock signals φ402a1, φ402a2, φ402b1, and φ402b2 are chopped ninety (90) degree out-of-phase with each other. The ninety degree out-of-phase difference between the chop clock signals of segmented chopping amplifier stages 302a and 302b is determined by the mathematical formula 180 degrees/N in which N equals the number of segmented chopping amplifier stages for the segmented chopping amplifier. In the example of FIGS. 3A, 4, and 5, N equals to two, and thus the signals for each of the segmented chopping amplifier stages are ninety degrees (180 degrees/2) out of phase with each other. If, for example, N equals four, then the chop clock signals would be forty-five (45) degrees (e.g., 180 degrees/4) out of phase and so on and so forth for other values of N.

Referring again to FIG. 5, the rate of non-overlap periods 502, 504, 506, 508, . . . , 550, 552 periodically occurring is four (4) times the chopping frequency fmchop of master chop clock signal φmchop (e.g., 4*fmchop) This rate of periodic occurrences results in the down modulation of noise at around 4*fmchop instead of 2*fmchop. In over-sampled converters, very little noise exists at the sampling frequency (fs). If the chop clock is designed such that fmchop equals fs/4 and the chop clock signal timing of FIG. 5 is utilized, then the increase in base-band noise due to aliasing would be insignificant. Such a design would avoid having to set fmchop at relatively high frequencies, such as fs/2, and instead fmchop can be set at lower frequencies (e.g., fs/4). Also, the advantage is more apparent with a higher N number of segmented chopping amplifier stages (e.g., fmchop=fs/8 for N=4 and fmchop=fs/16 for N=8).

Figure 6:
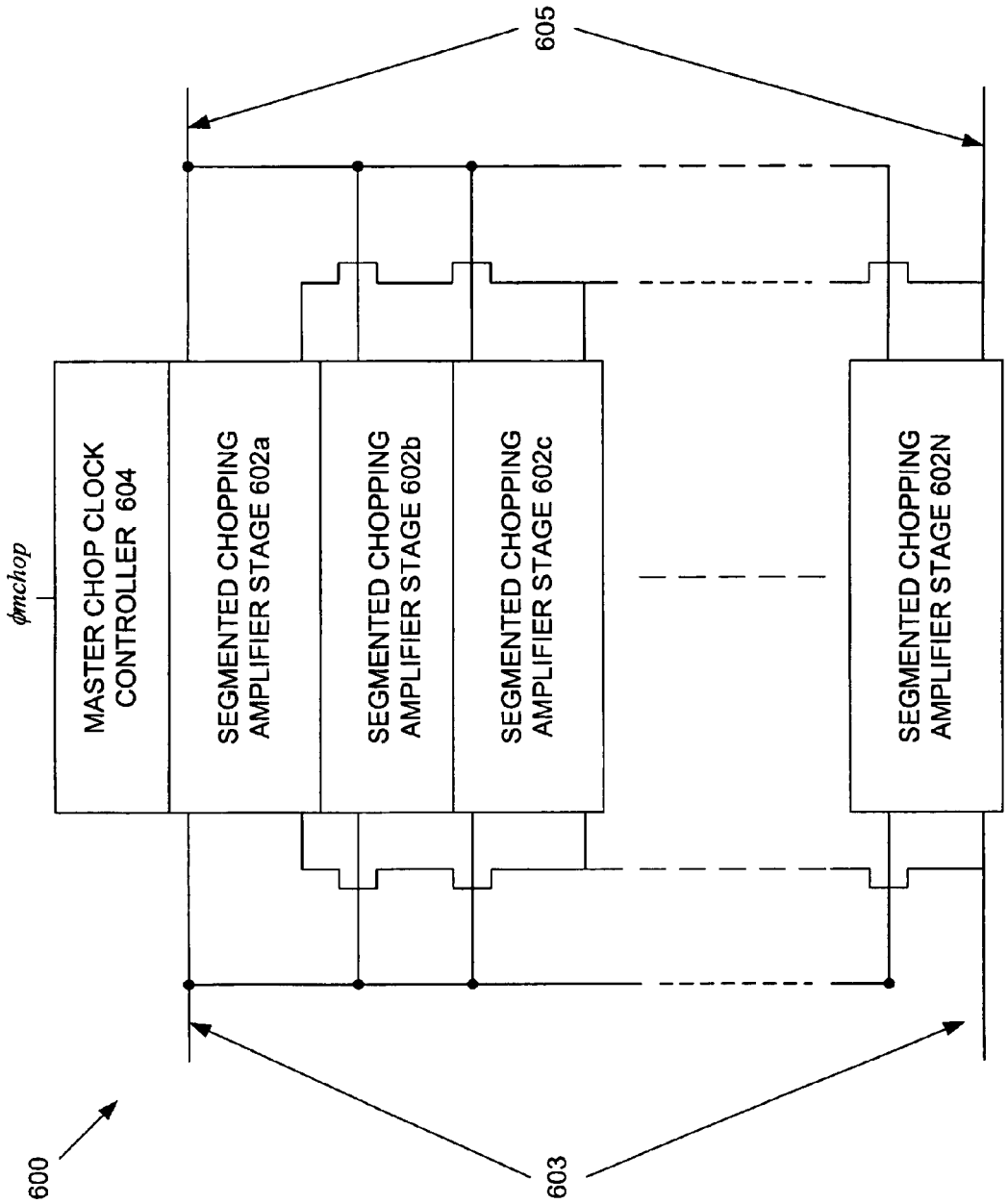
FIG. 6 is a block diagram of an exemplary segmented chopping amplifier with N number of segmented chopping amplifier stages in which N is an integer equal to two or greater according to the present invention.

Referring now to FIG. 6, a block diagram of an exemplary segmented chopping amplifier 600 with a master chop clock controller 604 and N number of segmented chopping amplifier stages 602a, 602b, 602c, . . . , 602N is shown. Master chop clock controller 604 has φmchop with a chopping frequency fmchop. Segmented chopping amplifier stages 602a, 602b, 602c, . . . , 602N are coupled together in parallel. The N number of segmented chopping amplifier stages 602a, 602b, 602c, . . . , 602N are responsive to master chop clock controller 604. Each segmented chopping amplifier stage 602a, 602b, 602c, . . . , 602N contributes 1/N amount of the overall gain of segmented chopping amplifier 600. Segmented chopping amplifier 600 segments the chopping operation of differential input signal 603 across the N number of segmented chopping amplifier stages 602a, 602b, 602c, . . . , 602N. Segmented chopping amplifier 600 generates differential output signal 605 from the N number of segmented chopping amplifier stages 602a, 602b, 602c, . . . , 602N.

In one embodiment, N is an integer multiple of two and equal to or greater than two. In this embodiment, the doubling of N number of segmented chopping amplifier stages 602a, 602b, 602c, . . . , 602N provides advantages in reducing chopping artifacts and aliasing of noise. For example, for every doubling of N number of segmented chopping amplifier stages 602a, 602b, 602c, . . . , 602N, magnitudes of chopping artifacts that are folded into an operational base-band of chopping amplifier 600 are reduced by 3 dB. Also, for every doubling of N number of segmented chopping amplifier stages 602a, 602b, 602c, . . . , 602N, aliasing of noise is reduced by 3 dB.

Mathematical support for the 3 dB reduction in magnitudes of chopping artifacts and aliasing of noise is as follows:

$$N_{nsys} = \text{Square Root of } (N_{n1}^2 + N_{n2}^2 + 2*K*N_{n1}*N_{n2}), \quad \text{Equation 1}$$

where:

$N_{nsys}$ is the resultant total root-mean-square (rms) value of chopping artifacts/aliased noise;

$N_{n1}$ is the rms value of chopping artifacts/aliased noise of first segmented chopping amplifier stage 302a; and $N_{n2}$ is the rms value of chopping artifacts/aliased noise of second segmented chopping amplifier stage 302b;

K is the correlation coefficient ($-1<=K<=+1$; K=0 means that the two sources of the chopping artifacts/aliased noise are un-correlated; K=+1/−1 means that the two sources of the chopping artifacts/aliased noise are fully correlated).

In the present invention, both the chopping artifacts/aliased noise for each segmented chopping amplifier stage add in an un-correlated manner (e.g., K=0) since segmented chopping amplifier stages 302a and 302b perform chopping operations independently of each other. Therefore, equation 1 simplifies to:

$$N_{nsys} = \text{Square Root of } (N_{n1}^2 + N_{n2}^2).$$

Thus, the above root mean square (rms) addition causes the magnitude of the total noise (e.g., for both chopping artifacts and the aliased noise) to decrease by 3 dB.

Figure 7:
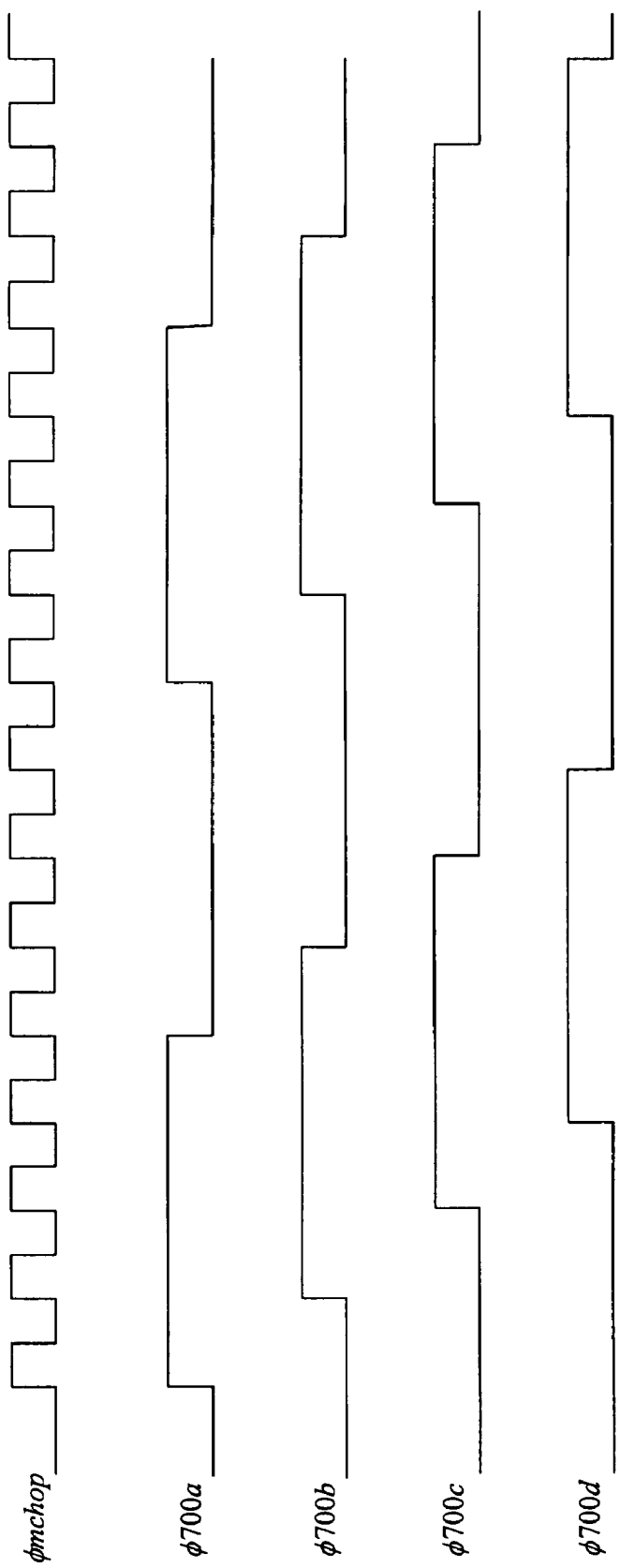
FIG. 7 are exemplary timing diagrams of a master chop clock signal and main chop clock signals utilized to generate non-overlapping chop clock signals for a segmented chopping amplifier having four segmented chopping amplifier stages.

With reference now to FIG. 7, exemplary timing diagrams of clock signals for a segmented chopping amplifier having N equal to four (4) segmented chopping amplifier stages are shown. Exemplary timing diagrams include a master clock signal φmchop for a master chop clock controller of segmented chopping amplifier having four (4) stages. Exemplary timing diagrams further include main chop clock signals φ700a, φ700b, φ700c, and φ700d. Main chop clock signals φ700a, φ700b, φ700c, and φ700d are utilized by a non-overlapping chop clock signal generator for generating non-overlapping chop clock signals for a segmented chopping amplifier having four segmented chopping amplifier stages. The non-overlapping chop clock signals would ideally be out of phase by forty-five (45) degrees (e.g., 180 degrees/N=45 degrees) so that non-overlapping periods of the non-overlapping chop clock signals occur at a periodic rate.

The present invention provides an improved chopping amplifier and method, which are a segmented chopping amplifier and method. The present invention provides a segmented chopping amplifier and method that resolve the open loop problem and avoids the runaway situation. The present invention also provides a segmented chopping amplifier and method that reduce aliasing of noise to the frequency baseband and the magnitude of chopping artifacts. The present invention overcomes the problems and disadvantages in accordance with the prior art.

While the invention has been particularly shown and described with reference to a preferred embodiment, it will be understood by those skilled in the art that various changes in form and detail may be made therein without departing from the spirit and scope of the invention.

What is claimed is:

1. A method of chopping an input signal by a chopping amplifier, comprising:
    segmenting, by a chopping amplifier, a chopping operation of an input signal across at least two chopping amplifier stages, wherein the at least two chopping amplifier stages are responsive to a master controller and wherein each of the at least two chopping, amplifier stages contributes a partial gain amount to an overall gain of the chopping amplifier and wherein the overall gain is a sum of the partial gain amounts of the at least two chopping amplifier stages; and
    wherein during non-switch transition periods, all of the at least two chopping amplifier stages are active and chopping; and
    wherein during a switch transition period, one of the at least two chopping amplifier stages is disconnected while all remaining ones of the at least two chopping amplifier stages are chopping.

2. The method according to claim 1, further comprising: controlling, by the master controller, operations of the at least two chopping amplifier stages.

3. The method according to claim 2, wherein each of the at least two chopping amplifier stages is independently controlled by the master controller.

4. The method according to claim 3, wherein the each of the at least two chopping amplifier stages is able to perform its own independent chopping operation.

5. The method according to claim 1, wherein the at feast two chopping amplifier stages are coupled together in parallel.

6. A method of chopping an input signal by a chopping amplifier, comprising:
    segmenting, by a chopping amplifier, a chopping operation of an input signal across at least two chopping amplifier stages, wherein the at least two chopping amplifier stages are responsive to a master controller and wherein each of the at least two choosing amplifier stages contributes a partial gain amount to an overall gain of the chopping amplifier and wherein the overall gain is a sum of the partial gain amounts of the at least two chopping amplifier stages; and
    staggering chop clock signals of the at least two chopping amplifier stages so that the chop clock signals of the at least two chopping amplifier stages have non-overlapping periods and at least one of the at least two chopping amplifier stages is not operating in an open loop at any given time.

7. The method according to claim 6, wherein the non-overlapping periods are, periodic non-overlapping periods so that a master chop clock of the master controller, can be operated at a lower chop clock frequency and low-level aliasing due to chopping is avoided.

8. The method according to claim 6, wherein the non-overlapping periods are periodic non-overlapping periods so that a master chop clock of the master controller can be operated at a lower chop clock frequency fc and low level aliasing due to chopping is avoided wherein the lower chop clock frequency fc is set equal to a sampling frequency fs/1(2*N).

9. A method of chopping an input signal by a chopping amplifier, comprising:
    segmenting, by chopping amplifier, a chopping operation of an input signal across at least two chopping amplifier stages, wherein the at least two chopping amplifier stages are responsive to a master controller and wherein each of the at least two chopping amplifier stages contributes a partial gain amount to an overall gain of the chopping amplifier and wherein the overall gain is a sum of the partial gain amounts of the at least two chopping amplifier stages; and
    wherein the at least two chopping amplifier stages are an N number of chopping amplifier stages, wherein N is an integer equal to or greater than two and wherein each of the N number of chopping amplifier stages contributes 1/N amount of an overall gain of the chopping amplifier.

10. The method according to claim 9, wherein, for every doubling of N number of chopping amplifier stages, magnitudes of chopping artifacts are reduced by 3 dB.

11. The method according to claim 9, wherein, for every doubling of N number of chopping amplifier stages, aliased components are reduced by 3 dB.

12. A chopping amplifier for chopping an input signal, comprising:
- at least two chopping amplifier stages, wherein a chopping operation of an input signal is segmented across the at least two chopping amplifier stages and wherein the at least two chopping amplifier stages are responsive to a master controller and wherein each of the at least two chopping amplifier stages contributes a partial gain amount to an overall gain of the chopping amplifier and wherein the overall gain is a sum of the partial gain amounts of the at least two chopping amplifier stages; and
- wherein during non-switch transition periods, all of the at least two chopping amplifier stages are active and chopping; and
- wherein during a switch transition period, one of the at least two chopping amplifier stages is disconnected while all remaining ones of the at least two chopping amplifier stages are chopping.

13. The chopping amplifier according to claim 12, wherein:
- the master controller for controlling operations of the at least two chopping amplifier stages.

14. The chopping amplifier according to claim 13, wherein the master controller independently controls each of the at least two chopping amplifier stages.

15. The chopping amplifier according to claim 14, wherein the each of the at least two chopping amplifier stages is able to perform its own independent chopping operation.

16. The chopping amplifier according to claim 12, wherein the at least two chopping amplifier stages are coupled together in parallel.

17. A chopping amplifier for chopping an input signal, comprising:
- at least two chopping amplifier stages, wherein a chopping operation of an input signal is segmented across the at least two chopping amplifier stages and wherein the at least two chopping amplifier stages are responsive to a master controller and wherein each of the at least two chopping amplifier stages contributes a partial gain amount to an overall gain of the chopping amplifier and wherein the overall gain is a sum of the partial gain amounts of the at least two chopping amplifier stages; and
- wherein chop clock signals of the at least two chopping amplifier stages are staggered so that the chop clock signals of the at least two chopping amplifier stages have non-overlapping periods and at least one of the at least two chopping amplifier stages is not operating in an open loop at any given time.

18. The chopping amplifier according to claim 17, wherein the non-overlapping periods are periodic non-overlapping periods so that a master chop clock of the master controller can be operated at a lower chop clock frequency and low-level aliasing due to chopping is avoided.

19. The chopping amplifier according to claim 17, wherein the non-overlapping periods are periodic non-overlapping periods so that a master chop dock of the master controller can be operated at a lower chop clock frequency fc and low-level aliasing due to chopping is avoided wherein the lower chop clock frequency fc is set equal to a sampling frequency fs (2*N).

20. A chopping amplifier for chopping an input signal, comprising:
- at least two chopping amplifier stages, wherein a chopping operation of an input signal is segmented across the at least two chopping amplifier stages and wherein the at least two chopping amplifier stages are responsive to a master controller and wherein each of the at least two chopping amplifier stages contributes a partial gain amount to an overall gain of the chopping amplifier and wherein the overall gain is a sum of the partial gain amounts of the at least two chopping amplifier stages; and
- wherein the at least two chopping amplifier stages are an N number of chopping amplifier stages, wherein N is an integer equal to or greater than two and wherein each of the N number of chopping amplifier stages contributes 1/N amount of an overall gain of the chopping amplifier.

21. The chopping amplifier according to claim 20, for every doubling of N number of chopping amplifier stages, magnitudes of chopping artifacts are reduced by 3 dB.

22. The chopping amplifier according to claim 20, for every doubling of N number of chopping amplifier stages, aliased components are reduced by 3 dB.

* * * * *